(12) United States Patent
Kalkbrenner

(10) Patent No.: US 6,754,085 B2
(45) Date of Patent: Jun. 22, 2004

(54) MOUNTING CIRCUIT BOARDS IN HOUSINGS

(75) Inventor: Peter R. Kalkbrenner, Eden Prairie, MN (US)

(73) Assignee: ADC Broadband Access Systems, Inc., Westborough, MA (US)

(*) Notice: Subject to any disclaimer, the term of this patent is extended or adjusted under 35 U.S.C. 154(b) by 0 days.

(21) Appl. No.: 10/002,218

(22) Filed: Nov. 1, 2001

(65) Prior Publication Data

US 2003/0063444 A1 Apr. 3, 2003

Related U.S. Application Data

(60) Provisional application No. 60/325,918, filed on Sep. 28, 2001.

(51) Int. Cl.[7] ............................................. H05K 5/06
(52) U.S. Cl. .................. 361/752; 361/797; 361/800; 361/803; 439/377
(58) Field of Search ........................ 361/752, 797, 361/803, 801, 683, 735, 770, 790, 792, 810, 725, 726, 742, 758, 741, 686, 802, 756, 727; 439/377

(56) References Cited

U.S. PATENT DOCUMENTS

| | | | | |
|---|---|---|---|---|
| 4,309,856 A | * | 1/1982 | Varnau et al. .............. | 248/694 |
| 5,008,777 A | * | 4/1991 | Burns ...................... | 174/138 G |
| 5,018,982 A | * | 5/1991 | Speraw et al. .......... | 174/138 D |
| 5,038,308 A | * | 8/1991 | Le et al. ...................... | 361/796 |
| 5,544,006 A | * | 8/1996 | Radloff et al. .............. | 361/683 |
| 5,801,928 A | * | 9/1998 | Burstedt et al. ............ | 361/752 |
| 5,963,432 A | * | 10/1999 | Crowley ................. | 174/138 G |
| 6,122,176 A | * | 9/2000 | Clements .................... | 361/752 |

* cited by examiner

*Primary Examiner*—Randy W. Gibson
*Assistant Examiner*—Hung Bui
(74) *Attorney, Agent, or Firm*—Fogg & Associates, LLC; Laura A. Ryan (57) ABSTRACT

A mounting apparatus having first and second blocks securable within a housing. The first block has first and second grooves for respectively receiving a first edge of a first circuit board and a first edge of a second circuit board such that the first and second circuit boards are aligned with each other and are spaced apart. The second block has a groove for receiving a second edge of the first circuit board that is perpendicular to the first edge of the first circuit board and a surface to which the second circuit board is attached adjacent a second edge of the second circuit board that is perpendicular to the first edge of the second circuit board.

15 Claims, 13 Drawing Sheets

MOUNTING CIRCUIT BOARDS IN HOUSINGS

CROSS REFERENCE TO RELATED APPLICATIONS

This application is related to and claims the benefit of the filing date of co-pending provisional application U.S. Ser. No. 60/325,918, filed on Sep. 28, 2001, which application is incorporated herein by reference.

TECHNICAL FIELD

The present invention relates generally to the field of housings and, in particular, to mounting circuit boards in housings.

BACKGROUND

Housings have been used for many years to contain and/or protect electronic equipment, such as circuit boards. For example, housings contain and/or protect the circuit boards in personal computers, consumer electronics, test equipment, telecommunications equipment, such as cable modem termination systems (CMTSs), etc.

Circuit board size and cooling requirements as well as housing size requirements often dictate circuit board mounting in housings. Therefore, circuit boards are mounted within housings in a variety of ways. For example, circuit boards are frequently located in slots (conventional slot mounting) within a housing so that the circuit boards are aligned with each other to reduce housing size and are spaced apart to form cooling passages between the respective circuit boards. In conventional slot mounting, each slot typically includes a pair of grooves (or card guides) located on opposing walls of the housing, and opposing edges of the respective circuit boards are respectively inserted into each of the pair of grooves.

Unfortunately, housing size constraints frequently require circuit boards to be oriented so that slot mounting is impractical or unfeasible. For example, a number of cable providers have expressed a need for less expensive cable modem termination systems (CMTSs) that are housed in smaller housings. In response to this need, some cable equipment manufacturers are developing lower-cost CMTSs where circuit boards from existing, more expensive CMTSs that were slot mounted in a large chassis or housing are mounted in newly designed, more compact housings. This involves orienting these circuit boards so that the circuit boards are aligned with each other and are spaced apart. However, this orientation cannot be accomplished using conventional slot mounting.

For the reasons stated above, and for other reasons stated below which will become apparent to those skilled in the art upon reading and understanding the present specification, there is a need in the art for mounting circuit boards in housings so that the circuit boards are aligned with each other and are spaced apart without using conventional slot mounting.

SUMMARY

The above-mentioned problems with using conventional slot mounting to mount circuit boards in housings and other problems are addressed by embodiments of the present invention and will be understood by reading and studying the following specification. Embodiments of the present invention provide for mounting circuit boards within a housing so that the circuit boards are aligned with each other to reduce housing size and are spaced apart to form cooling passages between the respective circuit boards without using conventional slot mounting.

More particularly, in one embodiment, a mounting apparatus having first and second blocks securable within a housing is provided. The first block has first and second grooves for respectively receiving a first edge of a first circuit board and a first edge of a second circuit board such that the first and second circuit boards are aligned with each other and are spaced apart. The second block has a groove for receiving a second edge of the first circuit board that is perpendicular to the first edge of the first circuit board and a surface to which the second circuit board is attached adjacent a second edge of the second circuit board that is perpendicular to the first edge of the second circuit board.

Another embodiment provides a method for mounting circuit boards within a housing. The method includes receiving a first edge of a first circuit board within a first groove in a first block and receiving a first edge of a second circuit board within a second groove in the first block such that the first and second circuit boards are aligned with each other and are spaced apart. Moreover, the method includes receiving a second edge of the first circuit board that is perpendicular to the first edge of the first circuit board within a groove in a second block. The method also includes securing the second circuit board adjacent a second edge of the second circuit board that is perpendicular to the first edge of the second circuit board to a surface of the second block.

Other embodiments are described and claimed.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
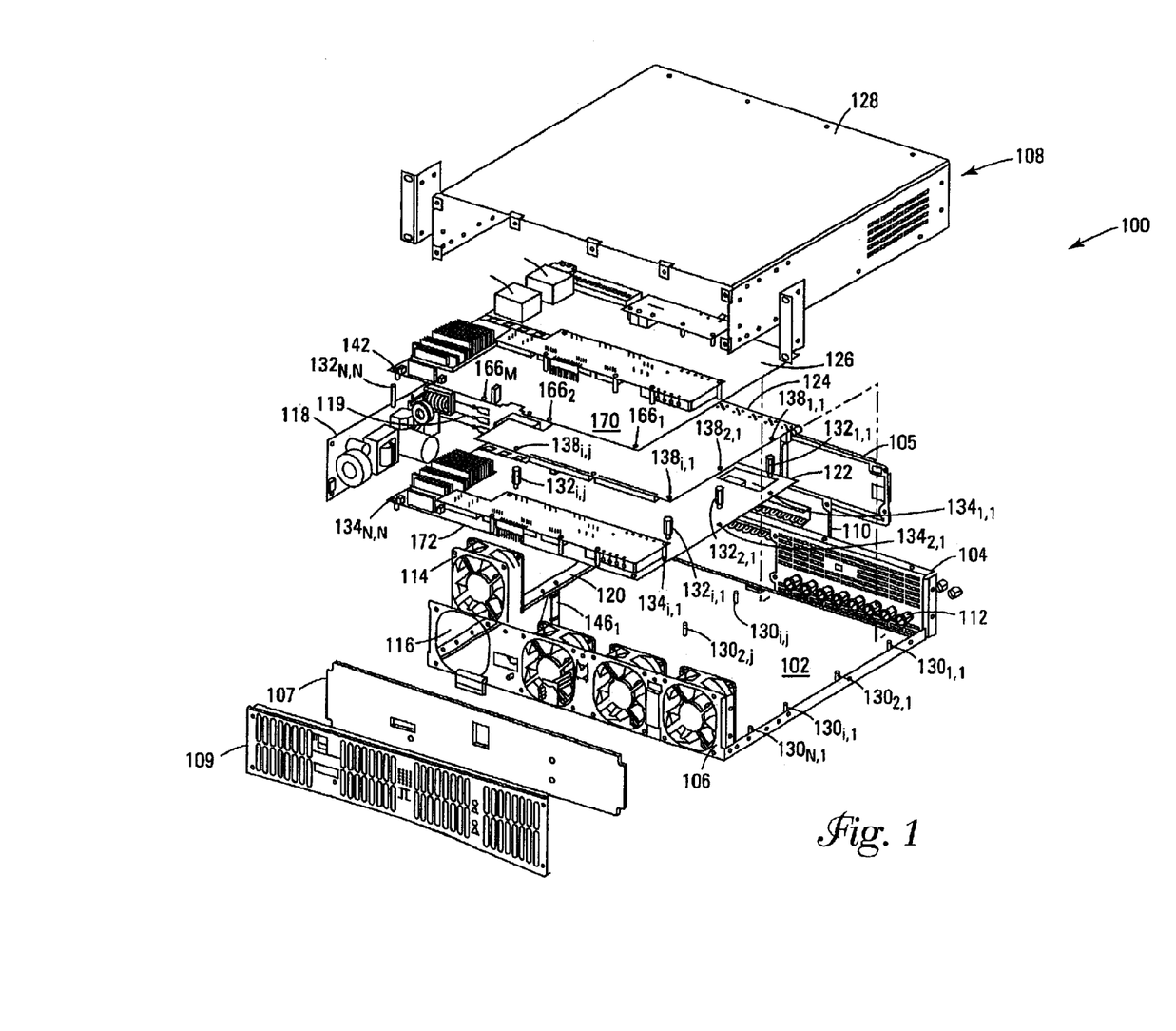
FIG. 1 is an exploded view of an embodiment of a housing according to the teachings of the present invention.
Figure 2:
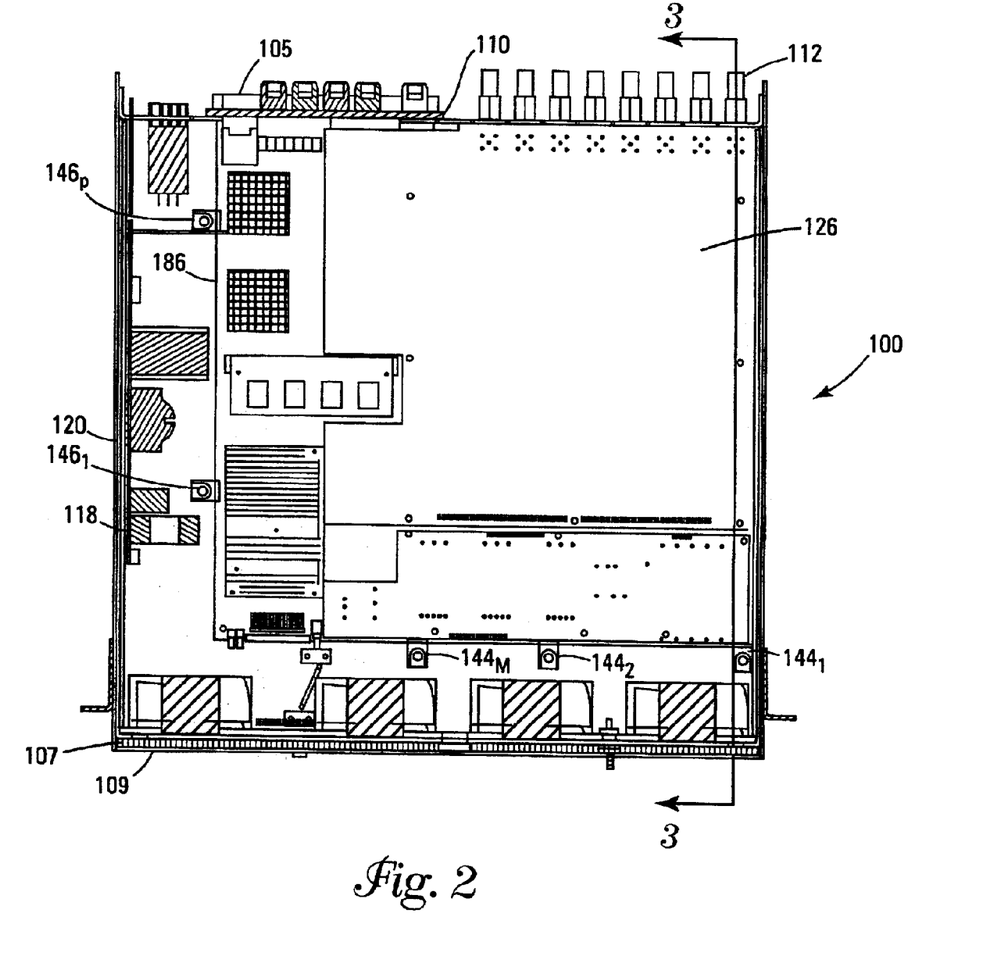
FIG. 2 is a top view of the housing of FIG. 1.
Figure 3:
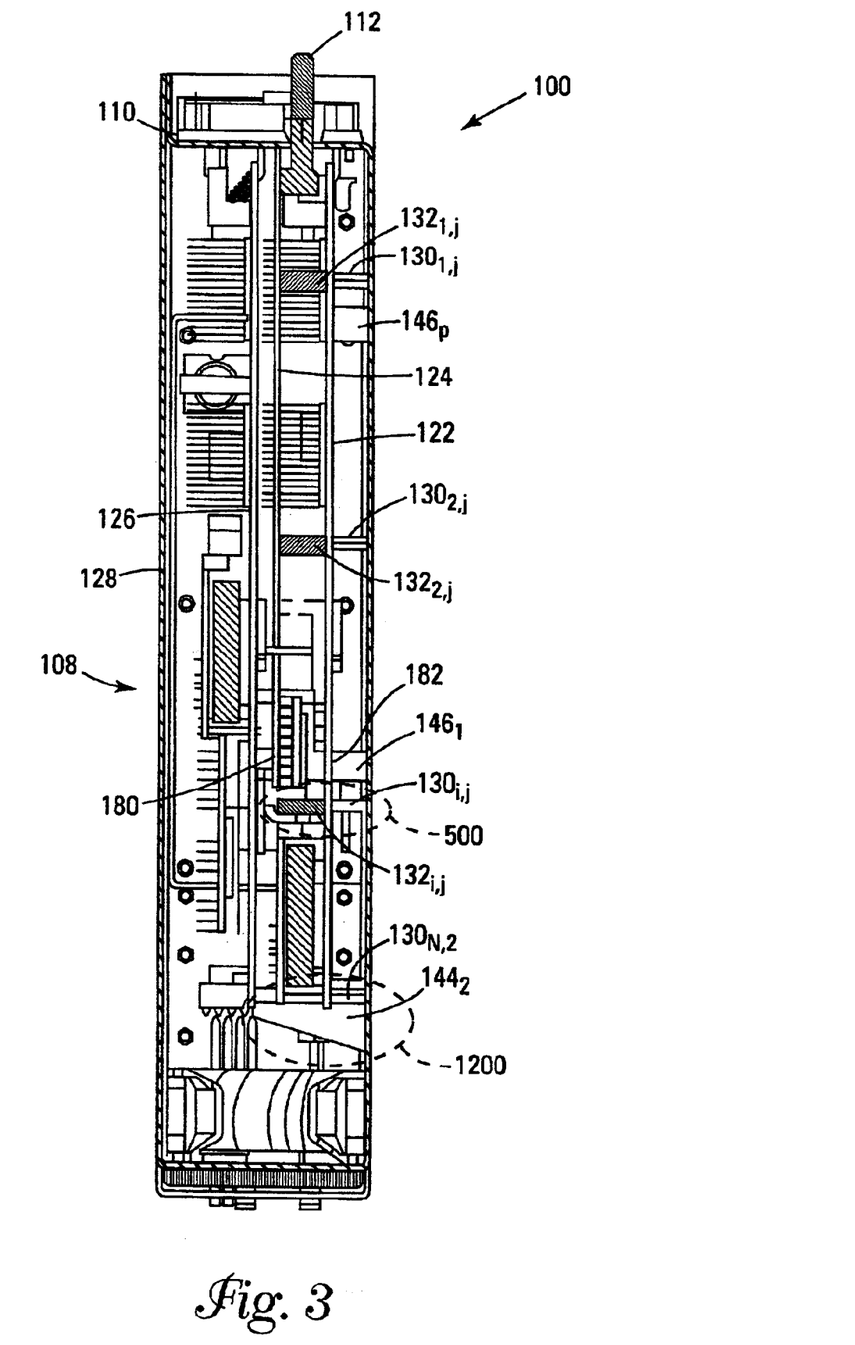
FIG. 3 is a view taken along line 3—3 in FIG. 2.

An embodiment of a housing 100, according to the teachings of the present invention, is illustrated in FIGS. 1–3. FIG. 1 is an exploded view of housing 100, FIG. 2 a top view, and FIG. 3 a view taken along line 3—3 of FIG. 2. Housing 100 has a base 102, walls 104 and 106, and cover 108. Wall 104 includes a circuit board 110 mounted thereon and a number of receptacles 112 that extend therethrough. In one embodiment, receptacles 112 are coaxial receptacles for receiving coaxial connectors. In another embodiment, a cover 105 (shown in FIG. 1) is secured to wall 104 and covers circuit board 110, as shown in FIG. 2. In yet another embodiment, a number of fans 114 are secured to wall 106 to respectively align with apertures 116 in wall 106. In some embodiments, an air filter 107 and a vented cover 109 are secured to wall 106, as shown in FIGS. 1 and 2. Housing 100 also includes a power supply 118 that is mounted perpendicular to base 102 and walls 104 and 106 at a side 120 of base 102. In one embodiment, circuit board 110 is connected to power supply 118 by connectors 119, as shown in FIG. 1. In another embodiment, base 102 and walls 104 and 106 are integral. In other embodiments, base 102, walls 104 and 106, and cover 108 are fabricated from aluminum, plastic, or the like.

As seen in FIGS. 1 and 3, circuit boards 122, 124, and 126 are aligned with each other, respectively spaced from each other, and are sandwiched between base 102 and a portion 128 of cover 108. Aligning circuit boards 122, 124, and 126 reduces the size of the housing. Spacing circuit boards 122, 124, and 126 from each other enables air from fans 114 to flow over each of circuit boards 122, 124, and 126 to remove heat created by each of circuit boards 122, 124, and 126.

In one embodiment, housing 100 houses a cable modem termination system. In this embodiment, circuit board 124 receives data from cable modems as analog radio frequency signals, converts the radio frequency signals into digital data packets, and transmits the digital data packets to circuit board 122, which, in this embodiment, is a cable modem termination system circuit board. Circuit board 122 transmits the digital data packets to circuit board 126. Circuit board 126 outputs the digital data packets as signals to circuit board 110, which in turn outputs these signals to a data network, e.g., the Internet. Circuit board 126 also receives digital data packets as signals from a data network and transmits the digital data packets to circuit board 122. Circuit board 122 transmits the digital data packets to circuit board 124. Circuit board 124 converts the digital data packets into analog radio frequency signals and transmits the radio frequency signals to the cable modems. In another embodiment, circuit boards 122, 124, and 126 comprise circuit boards from a CUDA 12000 cable modem termination system commercially available from ADC Telecommunications of Eden Prairie, Minn.

Figure 4:
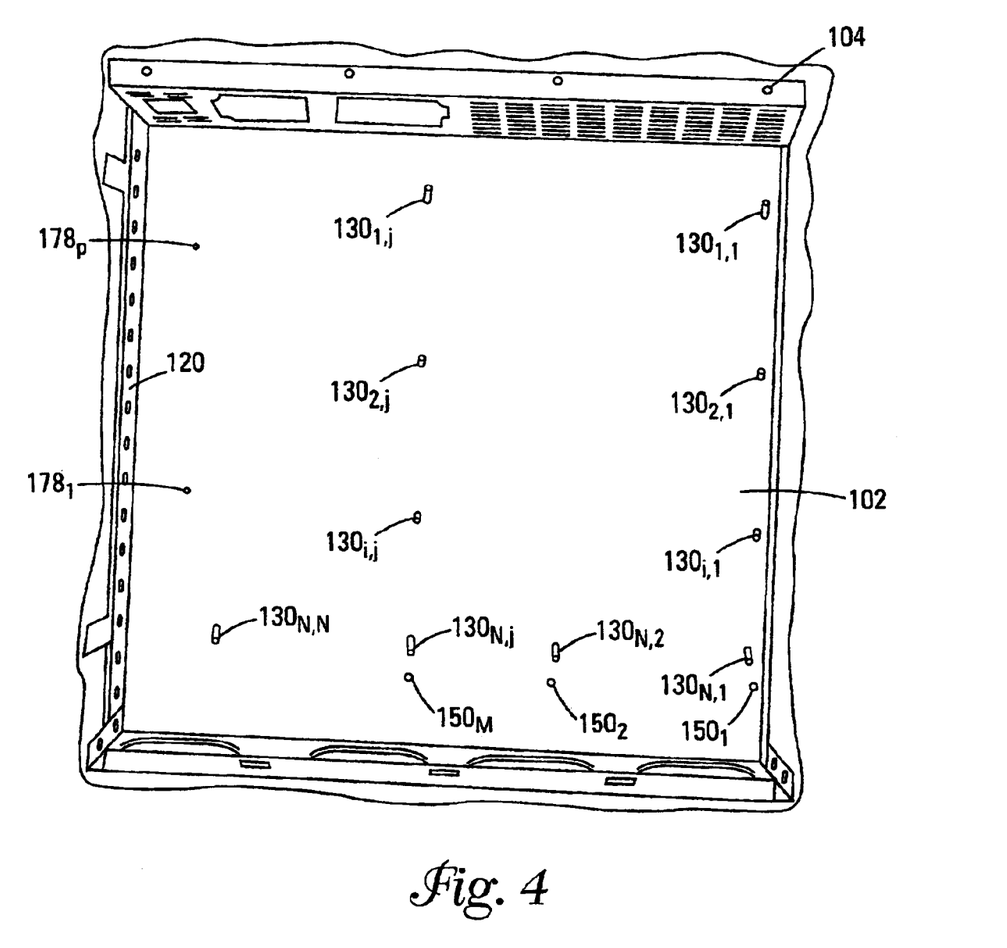
FIG. 4 is a top view of an embodiment of a base of the housing of FIG. 1.
Figure 5:
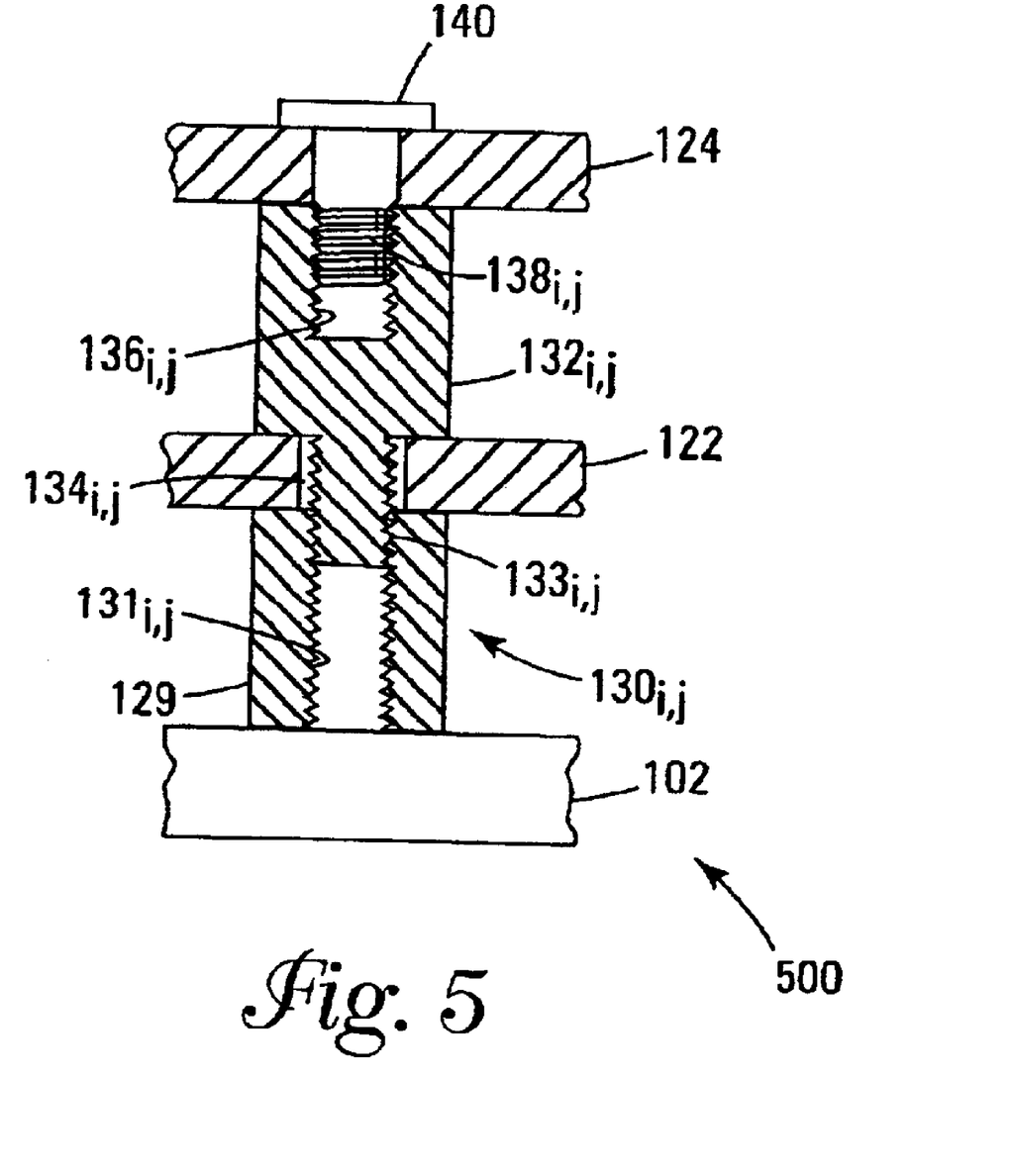
FIG. 5 is an enlarged view of region 500 in FIG. 3.

Circuit board 122 plugs into circuit board 110 and rests on spacers $130_{1,1}$ to $130_{N,N}$ that protrude from base 102 to space circuit board 122 from base 102, as shown in FIG. 3 for spacers $130_{1,j}$, $130_{2,j}$, $130_{i,j}$, and $130_{N,2}$. The pattern of spacers $130_{1,1}$ to $130_{N,N}$, for one embodiment, is illustrated in FIG. 4. In one embodiment, each of spacers $130_{1,1}$ to $130_{N,N}$ is an internally threaded tube. For example, spacer $130_{i,j}$ is a tube 129 having internal threads $131_{i,j}$, as shown in FIG. 5, an enlarged detailed view of region 500 in FIG. 3. In other embodiments, each of spacers $130_{1,1}$ to $130_{N,N}$ is fabricated from aluminum, plastic, or the like and is secured to base 102 by press fitting, welding, threading, gluing, or the like.

Circuit board 122 is secured to each of spacers $130_{1,1}$ to $130_{i,1}$, spacers $130_{1,j}$ to $130_{i,j}$, and spacer $130_{N,N}$ by respectively passing an externally threaded portion of each of spacers $132_{1,1}$ to $132_{i,1}$, spacers $132_{1,j}$ to $132_{i,j}$, and spacer $132_{N,N}$ through each of apertures $134_{1,1}$ to $134_{i,1}$, apertures $134_{1,j}$ to $134_{i,j}$, and aperture $134_{N,N}$ in circuit board 122 and respectively threading spacers $132_{1,1}$ to $132_{i,1}$, spacers $132_{1,j}$ to $132_{i,j}$, and spacer $132_{N,N}$ into spacers $130_{1,1}$ to $130_{i,1}$, spacers $130_{1,j}$ to $130_{i,j}$, and spacer $130_{N,N}$. For example, as shown in FIG. 5, externally threaded portion $133_{i,j}$ of spacer $132_{i,j}$ passes through aperture $134_{i,j}$ and threads into internal threads $131_{i,j}$ of spacer $130_{i,j}$. In one embodiment, each of spacers $132_{1,1}$ to $132_{i,1}$, spacers $132_{1,j}$ to $132_{i,j}$, and spacer $132_{N,N}$ has an internally threaded blind hole. For example, spacer $132_{i,j}$ has internally threaded blind hole $136_{i,j}$, as shown in FIG. 5. In one embodiment, each of spacers $132_{1,1}$ to $132_{i,1}$, spacers $132_{1,j}$ to $132_{i,j}$, and spacer $132_{N,N}$ is fabricated from aluminum, plastic, or the like.

Circuit board 124 plugs into receptacles 112, and spacers $132_{1,1}$ to $132_{i,1}$ and spacers $132_{1,j}$ to $132_{i,j}$ space circuit board 124 from circuit board 122, as shown in FIG. 3 for spacers $132_{1,j}$, $132_{2,j}$, and $132_{i,j}$. Apertures $138_{1,1}$ to $138_{i,1}$ and apertures $138_{1,j}$ to $138_{i,j}$ in circuit board 124 respectively align with the internally threaded blind holes of spacers $132_{1,1}$ to $132_{i,1}$ and spacers $132_{1,j}$ to $132_{i,j}$. A suitable fastener, such as a slot-, Philips-, Allen-, or hex-head screw or the like, passes through each of apertures $138_{1,1}$ to $138_{i,1}$ and apertures $138_{1,j}$ to $138_{i,j}$ and threads into each of the internally threaded blind holes of spacers $132_{1,1}$ to $132_{i,1}$ and spacers $132_{1,j}$ to $132_{i,j}$ to secure circuit board 124 to spacers $132_{1,1}$ to $132_{i,1}$ and spacers $132_{1,j}$ to $132_{i,j}$. For example, a fastener 140 passes through aperture $138_{i,j}$ and threads into blind hole $136_{i,j}$, as shown in FIG. 5. In one embodiment, circuit board 124 is electrically connected to circuit board 122.

Circuit board 126 plugs into circuit board 110. Blocks $144_1$ to $144_M$ and blocks $146_1$ to $146_P$ space circuit board 126 from circuit board 124 and secure circuit board 126 to base 102. Blocks $144_1$ to $144_M$ and blocks $146_1$ to $146_P$ also secure portions of circuit board 122, as discussed below. Moreover, spacer $132_{N,N}$ aligns with an aperture 142 in circuit board 126. A suitable fastener, such as a slot-, Philips-, Allen, or hex-head screw or the like, passes through aperture 142 and threads into spacer $132_{N,N}$ to secure a portion of circuit board 126 adjacent aperture 142 to spacer $132_{N,N}$.

Figure 6:
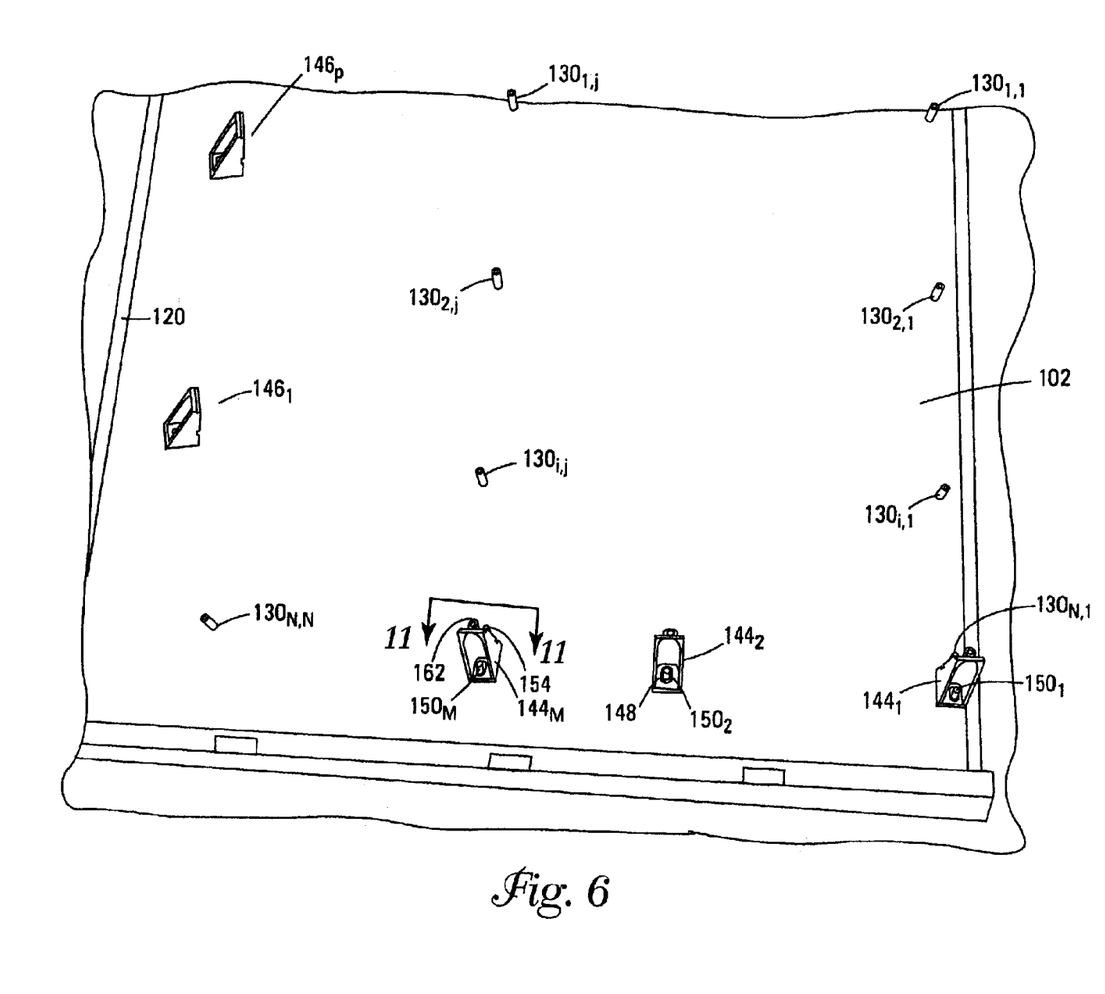
FIG. 6 is top view showing an embodiment of an arrangement of blocks on the base of FIG. 4.

FIG. 6 shows the positioning of blocks $144_1$ to $144_M$ and blocks $146_1$ to $146_P$ on base 102 for one embodiment. Each of blocks $144_1$ to $144_M$ is as depicted in FIGS. 7–10 for an exemplary block 144. Block 144 has a base 147 having a hole 148 passing therethrough for aligning with a respective one of apertures $150_1$ to $150_M$ in base 102, as shown in FIG. 6. In one embodiment, hole 148 is elongated, as shown in FIGS. 6, 8, 9, and 10, so that the position of block 144 is adjustable while hole 148 remains in alignment with the respective one of apertures $150_1$ to $150_M$. In another embodiment, apertures $150_1$, $150_2$, and $150_M$ are respectively adjacent spacers $130_{N,1}$, $130_{N,2}$, and $130_{N,j}$, as shown in FIG. 4. In other embodiments, each of apertures $150_1$ to $150_M$ is threaded, and a threaded fastener, such as a slot-, Philips-, Allen-, or hex-head screw or the like, passes through hole 148 and threads into the apertures $150_1$ to $150_M$ to secure each of blocks $144_1$ to $144_M$ to base 102. In one embodiment, each of apertures $150_1$ to $150_M$, exemplified by aperture 150 in FIG. 10, consists of an internally threaded tube 149 that protrudes from base 102 and extends into hole 148. In one embodiment, tube 149 is plastic, metal, such as aluminum, or the like and is secured to base 102 by press fitting, threading, welding, gluing, etc.

Figure 9:
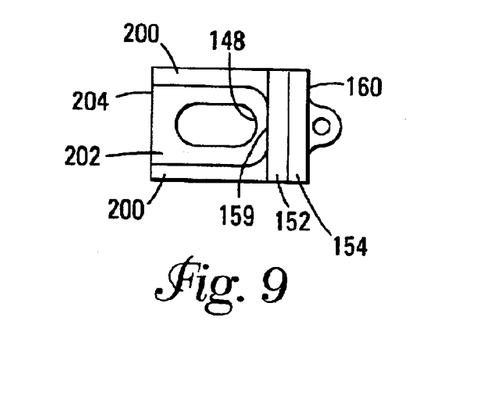
FIG. 9 is a view taken along line 9—9 in FIG. 7.
Figure 10:
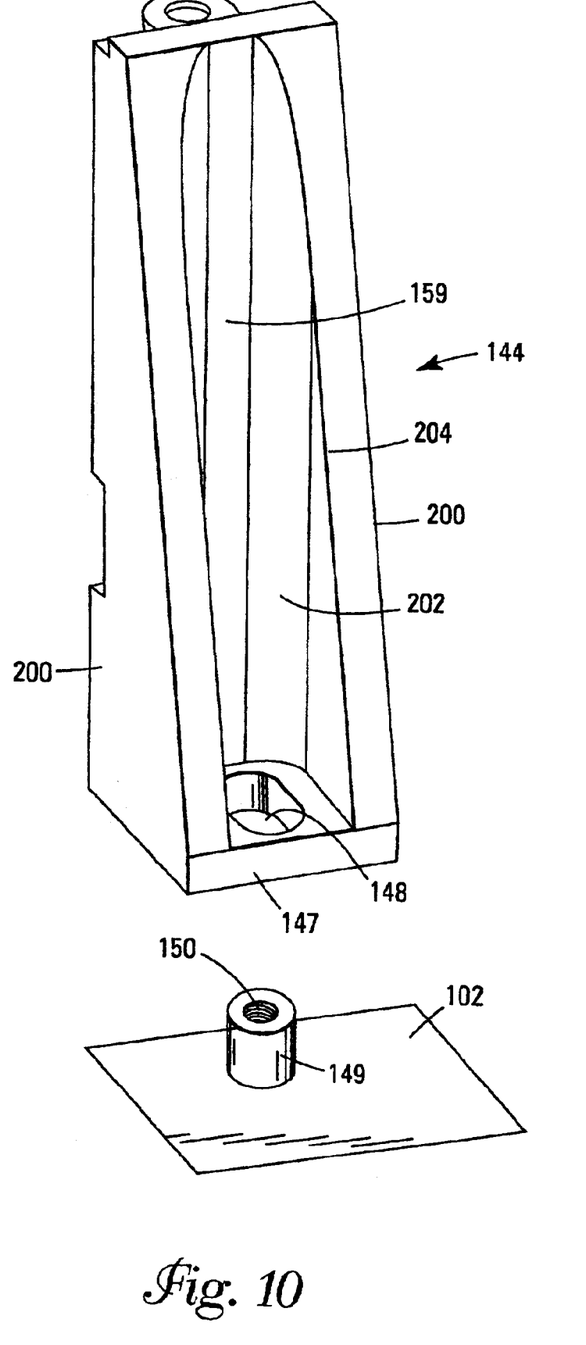
FIG. 10 is an exploded rear isometric view of an embodiment of positioning the block in FIG. 7 on the base of FIG. 4.

As seen in FIGS. 9 and 10, block 144 has a wall 159. Wall 159 is integral with and perpendicular to base 147. Block 144 also has a pair of opposing walls 200 that are integral with and perpendicular to wall 159 and base 147. In one embodiment, each of walls 200 has a substantially triangular profile. Wall 159, walls 200, and base 147 define a cavity 202 within block 144, as shown in FIGS. 9 and 10, which, in one embodiment, is substantially triangular in shape. Cavity 202 has an opening 204 lying in a plane that forms an acute angle with base 147. Cavity 202 provides an access for hole 148. For example, a threaded fastener, such as a slot-, Philips-, Allen-, or hex-head screw or the like, is passed through opening 204 and into cavity 202. The fastener is then passed through hole 148 and threaded into aperture 150.

Figure 7:
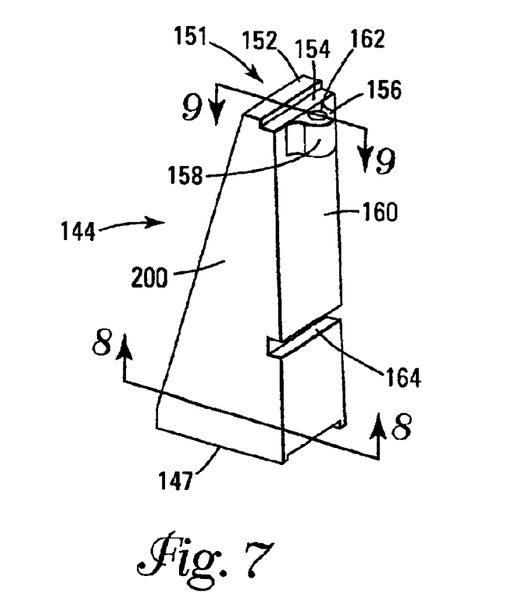
FIG. 7 is a front isometric view of an embodiment of a block according to the teachings of the present invention.
Figure 8:
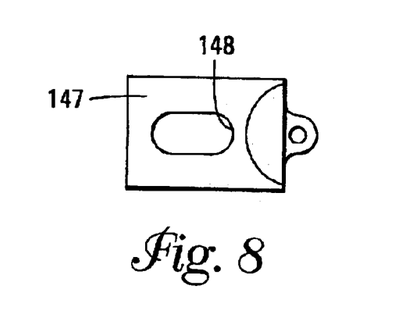
FIG. 8 is a view taken along line 8—8 in FIG. 7.

Block 144 has a tiered surface 151 that includes a surface 152 and a surface 154, as shown in FIG. 7. Surface 154 is integral and substantially flush with a surface 156 of a projection 158 of a face 160 of block 144. A threaded aperture 162 passes through projection 158. Block 144 also has a groove 164 on face 160 that is substantially parallel to tiered surface 151. In one embodiment, block 144 is fabricated from plastic, e.g., Delrin, metal, e.g., aluminum, or the like.

Figure 11:
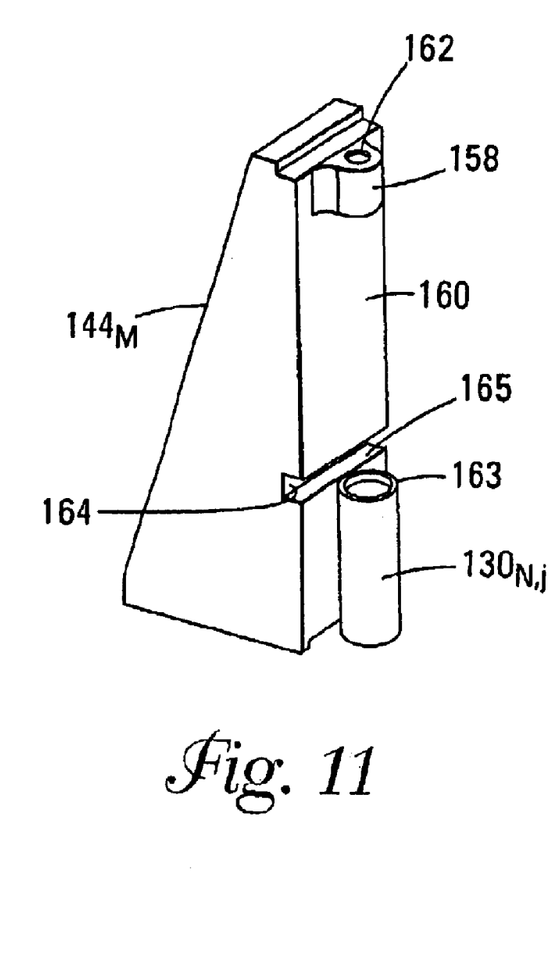
FIG. 11 is a view taken along line 11—11 in FIG. 6.

FIG. 11 demonstrates for block $144_M$ and spacer $130_{N,j}$ that, in one embodiment, when blocks $144_1$ to $144_M$ are positioned on base 102, as shown in FIG. 6, face 160 is adjacent spacers $130_{N,1}$, $130_{N,2}$, and $130_{N,j}$ and an end 163 of each of spacers $130_{N,1}$, $130_{N,2}$, and $130_{N,j}$ is substantially flush with a longitudinal boundary 165 of groove 164.

Figure 12:
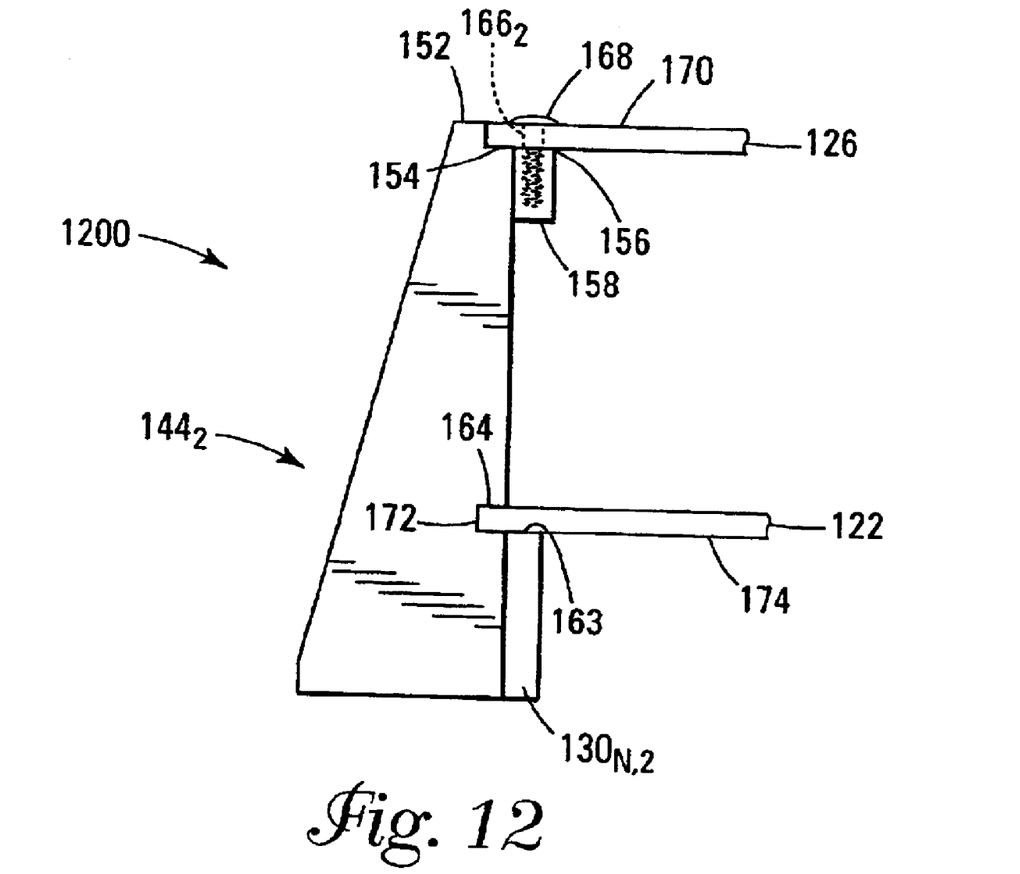
FIG. 12 is an enlarged view of region 1200 in FIG. 3.

Apertures $166_1$ to $166_M$ in circuit board 126 (shown in FIG. 1) are respectively aligned with the threaded aperture 162 in each of blocks $144_1$ to $144_M$. A fastener, such as a slot-, Philips-, Allen-, or hex-head screw or the like, passes through each of apertures $166_1$ to $166_M$ and is threaded into the threaded aperture 162 in each of blocks $144_1$ to $144_M$ to secure circuit board 126 to each of blocks $144_1$ to $144_M$. For example, FIG. 12, an enlarged view of region 1200 in FIG. 3, shows a fastener 168 passing through aperture $166_2$ of circuit board 126 and threading into aperture 162 of block $144_2$. FIG. 12 also demonstrates for block $144_2$ that circuit board 126 is secured to surface 154 of tiered surface 151 and surface 156 of projection 158 of each of blocks $144_1$ to $144_M$ so that a surface 170 of circuit board 126 is substantially flush with surface 152 of tiered surface 151. Moreover, FIG. 12 shows for block $144_2$ that groove 164 of each of blocks $144_1$ to $144_M$ receives an edge 172 (shown in FIG. 1) of circuit board 122 and that a portion of a surface 174 adjacent edge 172 of circuit board 122 rests on end 163 of each of spacers $130_{N,1}$, $130_{N,2}$, and $130_{N,j}$. This serves to secure circuit board 122 adjacent edge 172.

Figure 13:
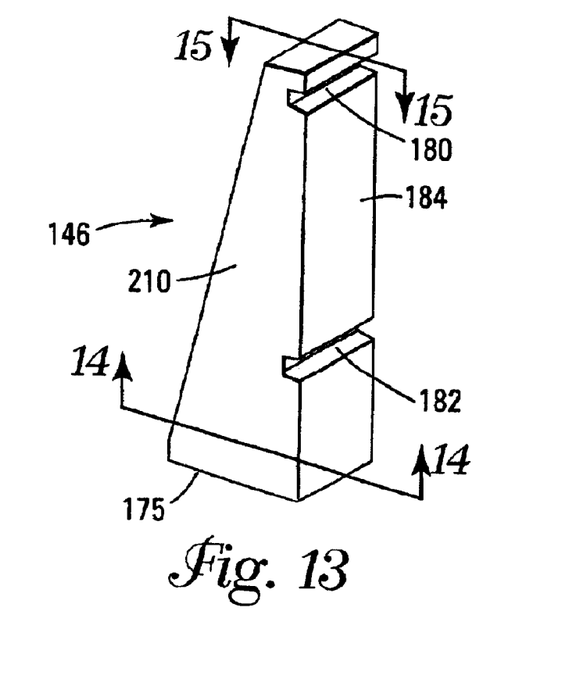
FIG. 13 is a front isometric view of another embodiment of a block according to the teachings of the present invention.
Figure 14:
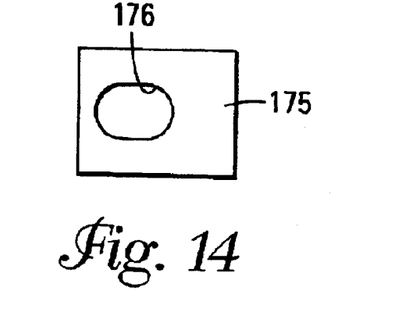
FIG. 14 is a view taken along line 14—14 in FIG. 13.
Figure 15:
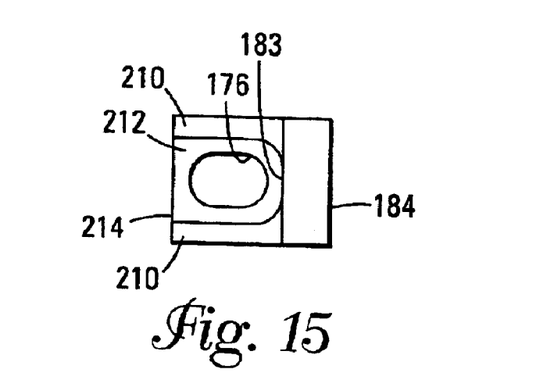
FIG. 15 is a view taken along line 15—15 in FIG. 13.
Figure 16:
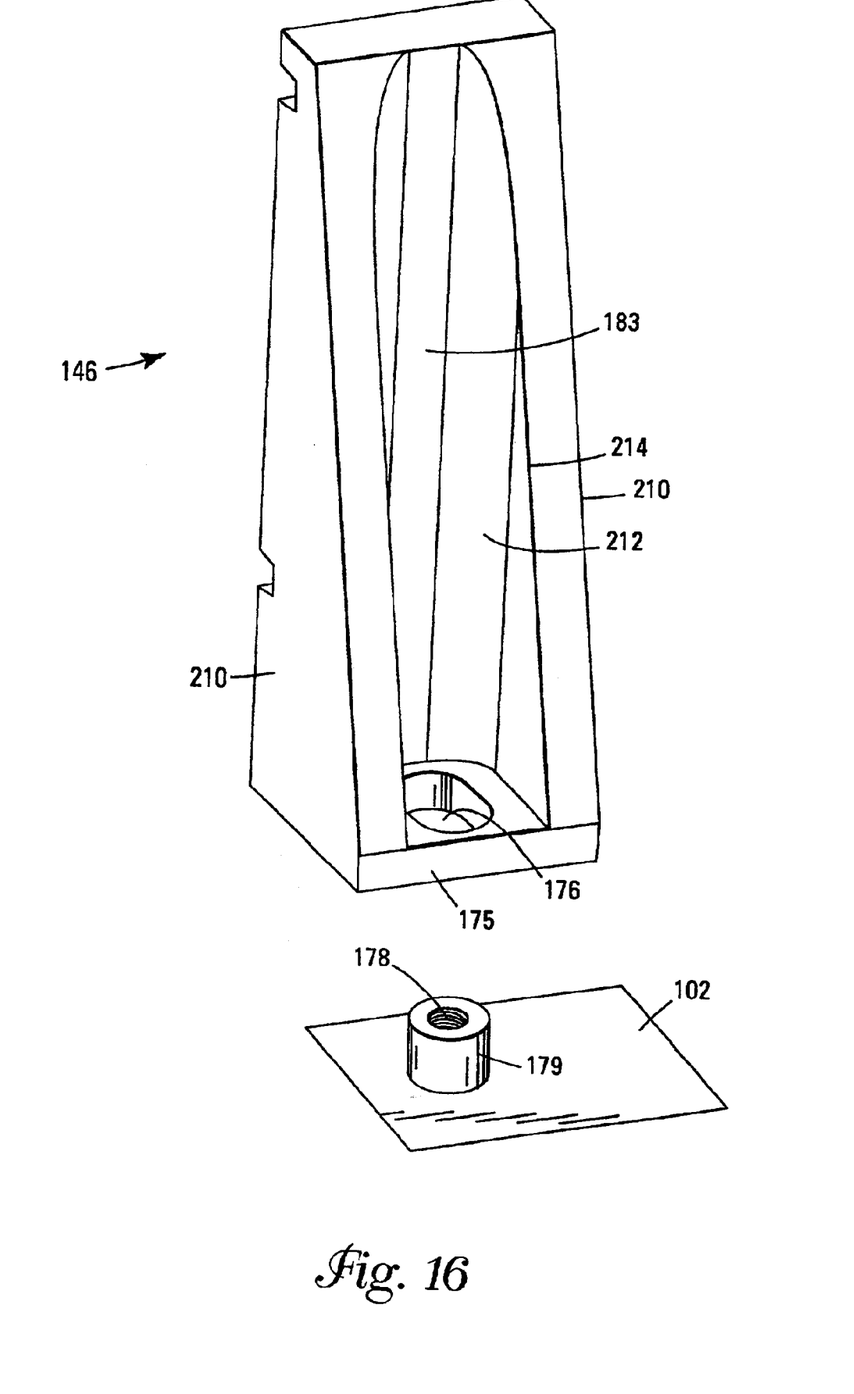
FIG. 16 is an exploded rear isometric view of an embodiment of positioning the block in FIG. 13 on the base of FIG. 4.

Each of blocks $146_1$ to $146_P$ is as depicted in FIGS. 13–17 for an exemplary block 146. Block 146 has a base 175 having a hole 176 passing therethrough for aligning with a respective one of apertures $178_1$ to $178_P$ in base 102. Apertures $178_1$ to $178_P$ are shown in FIG. 4. In one embodiment, each of apertures $178_1$, to $178_P$ is threaded, and a threaded fastener, such as a slot-, Philips-, Allen-, or hex-head screw or the like, passes through hole 176 and threads into the apertures $178_1$ to $178_P$ to secure each of blocks $146_1$ to $146_P$ to base 102. In another embodiment, hole 176 is elongated, as shown in FIGS. 14, 15, and 16, so that the position of block 146 is adjustable while hole 176 remains in alignment with the respective one of apertures $178_1$ to $178_P$. In other embodiments, each of apertures $178_1$ to $178_P$, exemplified by aperture 178 in FIG. 16, consists of an internally threaded tube 179 that protrudes from base 102 and extends into hole 176. In one embodiment, tube 179 is plastic, metal, such as aluminum, or the like and is secured to base 102 by press fitting, threading, welding, gluing, etc.

As shown in FIGS. 15 and 16, block 144 has a wall 183. Wall 183 is integral with and perpendicular to base 175. Block 144 also has a pair of opposing walls 210 that are integral with and perpendicular to wall 183 and base 175. In one embodiment, each of walls 210 has a substantially triangular profile. Wall 183, walls 210, and base 175 define a cavity 212 within block 146, as shown in FIGS. 15 and 16, which, in one embodiment, is substantially triangular in shape. Cavity 212 has an opening 214 lying in a plane that forms an acute angle with base 175. Cavity 212 provides an access for hole 176. For example, a threaded fastener, such as a slot-, Philips-, Allen-, or hex-head screw or the like, is passed through opening 214 and into cavity 212. The fastener is then passed through hole 176 and threaded into aperture 178.

Figure 17:
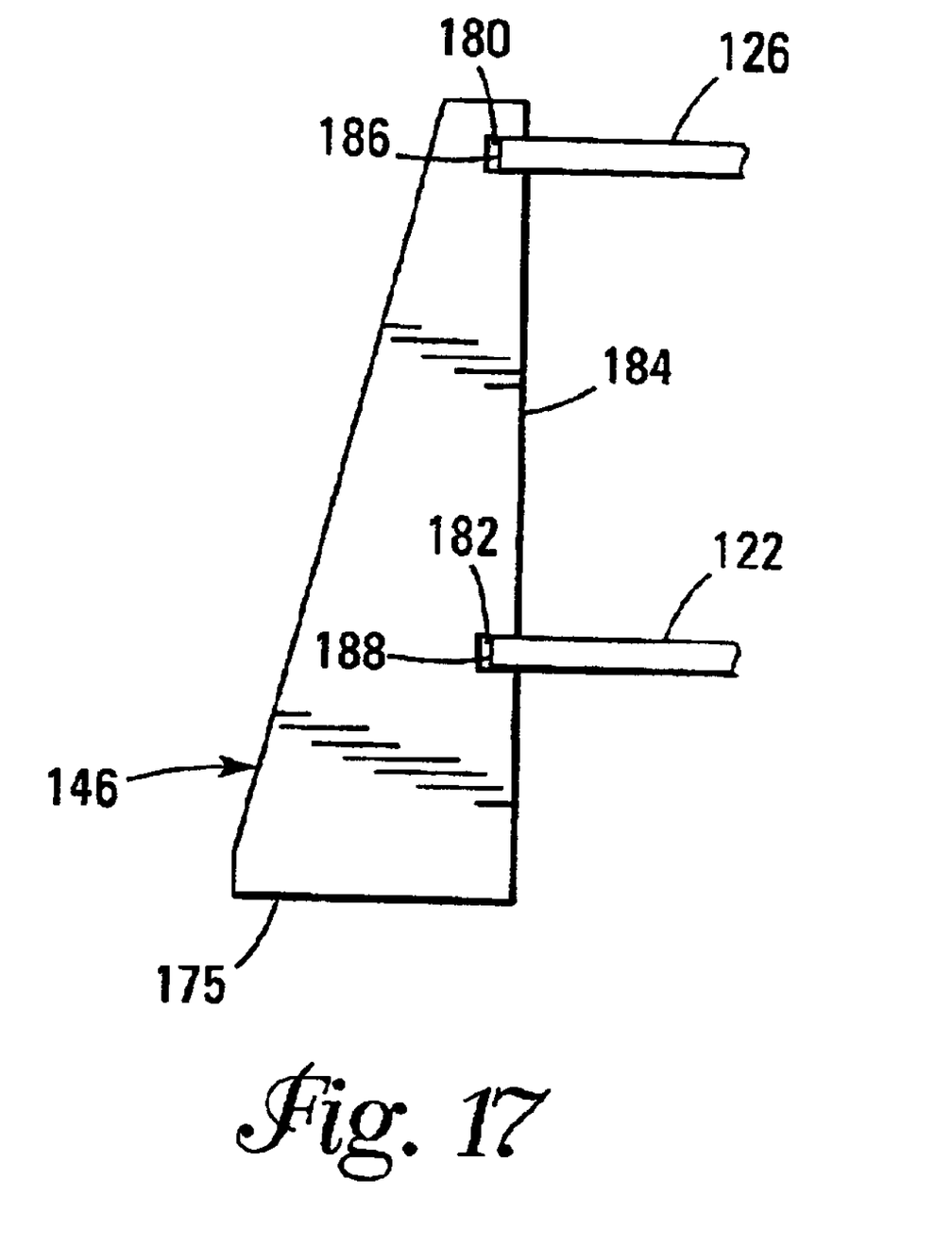
FIG. 17 is a side view of the block in FIG. 13 receiving a pair of circuit boards according to the teachings of the present invention.

Block 146 has a tapered groove 180 and a tapered groove 182 on a face 184. Each of tapered grooves 180 and 182 taper in a direction away from face 184, as shown in FIG. 13. Tapered groove 180 receives and grasps an edge 186 of circuit board 126, as shown in FIG. 17, to secure circuit board 126 at edge 186. FIG. 2 shows edge 186 of circuit board 126 as grasped by the tapered groove 180 of each of blocks $146_1$ to $146_P$. Tapered groove 182 receives and grasps an edge 188 (perpendicular to edge 172) of circuit board 122, as shown in FIG. 17, to secure circuit board 122 at edge 188. FIG. 3 shows tapered grooves 180 and 182 respectively grasping circuit boards 126 and 122. In one embodiment, each of blocks $146_1$ to $146_P$ is fabricated from plastic, e.g., Delrin, metal, e.g., aluminum, or the like.

CONCLUSION

Embodiments of the present invention have been described. The embodiments provide for mounting circuit boards within a housing so that the circuit boards are aligned with each other to reduce housing size and are spaced apart to form cooling passages between the respective circuit boards without using conventional slot mounting.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, embodiments of the present invention are not limited to mounting circuit boards within housings of the type of housing 100. Rather, embodiments of the present invention can be used to mount circuit boards within any housing in lieu of conventional slot mounting.

What is claimed is:

1. A mounting apparatus comprising:
   at least one first block securable within a housing, the at least one first block having first and second grooves for respectively receiving a first edge of a first circuit board and a first edge of a second circuit board such that the first and second circuit boards are aligned with each other and are spaced apart; and at least one second block securable within the housing, the at least one second block having a groove for receiving a second edge of the first circuit board that is perpendicular to the first edge of the first circuit board, the at least one second block having a surface to which the second circuit board is attached adjacent a second edge of the second circuit board that is perpendicular to the first edge of the second circuit board;

wherein at least one of the first and second grooves in the at least one first block is tapered;

wherein the at least one first block having first and second grooves for respectively receiving first edge of the first circuit board and the first edge of the second circuit board and the at least one second block having a groove for receiving the second edge of the first circuit board comprises the at least one first block having first and second grooves for grasping and securing the first edge of the first circuit board and the first edge of the second circuit board and the at least one second block having a groove for grasping and securing the second edge of the first circuit board.

2. The apparatus of claim 1, wherein the at least one first block comprises a plurality of first blocks.

3. The apparatus of claim 1, wherein the at least one second block comprises a plurality of second blocks.

4. The apparatus of claim 1, wherein the surface of the at least one second block comprises a surface of a projection of the at least one second block, the projection having an aperture passing therethrough.

5. The apparatus of claim 4, wherein the aperture is threaded.

6. The apparatus of claim 4, wherein the aperture aligns with an aperture in the second circuit board and a fastener passes through the aperture in the second circuit board and into the aperture in the projection of the at least one second block to secure the second circuit board to the at least one second block.

7. The apparatus of claim 1, wherein one or more of the at least one first and second blocks comprises a hole passing therethrough for receiving a fastener for securing at least one of the first and second blocks to the housing.

8. The apparatus of claim 7, wherein the hole is elongated.

9. A mounting apparatus comprising:

a plurality of first blocks securable within a housing, each of the plurality of first blocks having first and second tapered grooves for respectively rasping a first edge of a first circuit board and a first edge of a second circuit board such that the first and second circuit boards are aligned with each other and are spaced apart; and a plurality of second blocks securable within the housing, each of the plurality of second blocks having a slot for receiving a second edge of the first circuit board that is perpendicular to the first edge of the first circuit board, each of the plurality of second blocks having a surface to which the second circuit board is attached adjacent a second edge of the second circuit board that is perpendicular to the first edge of the second circuit board;

wherein the first and second circuit boards are secured via the grasped first edge of the first circuit board and the grasped first edge of the second circuit board, respectively.

10. The apparatus of claim 9, wherein the surface of each of the plurality of second blocks comprises a surface of a projection of each of the plurality of second blocks, the projection of each of the plurality of second blocks having an aperture passing therethrough.

11. The apparatus of claim 10, wherein the aperture of the projection of each of the plurality of second blocks is threaded.

12. The apparatus of claim 10, wherein the aperture of the projection of each of the plurality of second blocks respectively aligns with one of a plurality of apertures in the second circuit board and a fastener passes through each of the plurality of apertures in the second circuit board and into the aperture of the projection of each of the plurality of second blocks to secure the second circuit board to each of the plurality of second blocks.

13. The apparatus of claim 9, wherein each of the plurality of first blocks comprises an elongated hole passing therethrough for receiving a fastener for securing each of the plurality of first blocks to the housing.

14. The apparatus of claim 9, wherein each of the plurality of second blocks comprises an elongated hole passing therethrough for receiving a fastener for securing each of the plurality of second blocks to the housing.

15. A mounting apparatus comprising:

a first block securable within a housing, the first block having first and second tapered grooves for respectively grasping and securing a first edge of a first circuit board and a first edge of a second circuit board such that the first and second circuit boards are aligned with each other and are spaced apart; and a second block securable within the housing, the second block having a groove for receiving a second edge of the first circuit board that is perpendicular to the first edge of the first circuit board, the second block comprising a projection having a surface and an aperture passing through the projection;

wherein the aperture in the projection of the second block aligns with an aperture in the second circuit board and a fastener passes through the aperture in the second circuit board and into the aperture in the projection of the second block to secure the second circuit board to the surface of the projection adjacent a second edge of the second circuit board that is perpendicular to the first edge of the second circuit board.

* * * * *